BANDWIDTH COMPENSATION FOR HIGH SPEED RAMP VOLTAGE GENERATOR EMPLOYING TWO SERIES CONNECTED PARALLEL RC NETWORKS

Filed April 16, 1964

INVENTORS.
RICHARD H. CASEY
ALFRED E. POPODI
BY
H. H. Losche
ATT'YS

United States Patent Office 3,292,011

Patented Dec. 13, 1966

3,292,011

BANDWIDTH COMPENSATION FOR HIGH SPEED RAMP VOLTAGE GENERATOR EMPLOYING TWO SERIES CONNECTED PARALLEL RC NETWORKS

Richard H. Casey, Laurel, and Alfred E. Popodi, Glen Burnie, Md., assignors, by mesne assignments, to the United States of America as represented by the Secretary of the Navy Filed Apr. 16, 1964, Ser. No. 360,468
5 Claims. (Cl. 307—88.5)

This invention relates to sweep voltage generators for cathode ray tube circuits and more particularly to a bandwidth compensation circuit in combination with the sweep voltage generator to produce fast linear sweep voltages with good resolution.

The generation of accurate, fast cathode ray tube deflection in high resolution radar systems presents difficult problems. Sweep durations of less than 10 microseconds are often encountered, coupled with close linearity control to prevent loss of resolution and information. There are primarily two reasons for the existence of nonlinearities in this system. First, the limited bandwidth and ramp rate in the deflection amplifier (electrostatic or magnetic), cause initial distortion (or lag) associated with a constant time delay even if it is driven from a perfect sawtooth source. The second error originates in the sweep generator because of its limited gain-bandwidth product. For high sweep speeds, the integrating resistor and capacitor combination in the sweep generator must be small in order to develop the necessary output for fast ramp voltages. Furthermore, because of the required high bandwidth of the amplifier its gain will be relatively small for a given gain-bandwidth product. Therefore, the effective integrating time constant, which is given by the product of the resistance and capacitance, along with the amplifier gain, is compromised, resulting in exponential deviation from the linear rise of the ramp function voltage generated.

In the present invention these errors are minimized or substantially reduced by preceding the sweep voltage generator with a compensating circuit to produce a properly timed current flow and voltage waveform to compensate for the nonlinearities in the sweep voltage generator and the lag in the deflection amplifier for the cathode ray tube. This compensating circuit includes a crystal rectifier in the input to the sweep generator preceded by two resistance-capacitance (RC) parallel networks in series from a voltage source to the anode input of the crystal rectifier. The juncture of the two RC parallel networks is coupled through the collector and emitter of a transistor to the opposite pole of the voltage source. The base electrode of the transistor is coupled to a sweep gate input for the sweep generator and this base is biased to hold the transistor in saturation until the occurrence of a negative sweep gate pulse. The time constants of the two RC parallel networks can be so related to produce initial current flow to the input of the integrating circuit of the sweep voltage generator to compensate for the initial nonlinearity of the sweep voltage generator and at the same time to over compensate for the nonlinearity of the sweep voltage generator to compensate for the lag or droop in the ramp voltage amplified by the deflection amplifier of the cathode ray tube. It is therefore a general object of this invention to provide a bandwidth compensating circuit for a high speed ramp voltage generator to generate sweep voltages for a cathode ray tube that presents substantially linear ramp function voltages at the deflection plates of the cathode ray tube in time correspondence with the sweep gate pulse.

These and other objects and the attendant advantages, features, and uses will become more apparent to those skilled in the art when considered along with the accompanying drawing, in which.

Figures 1, 2:
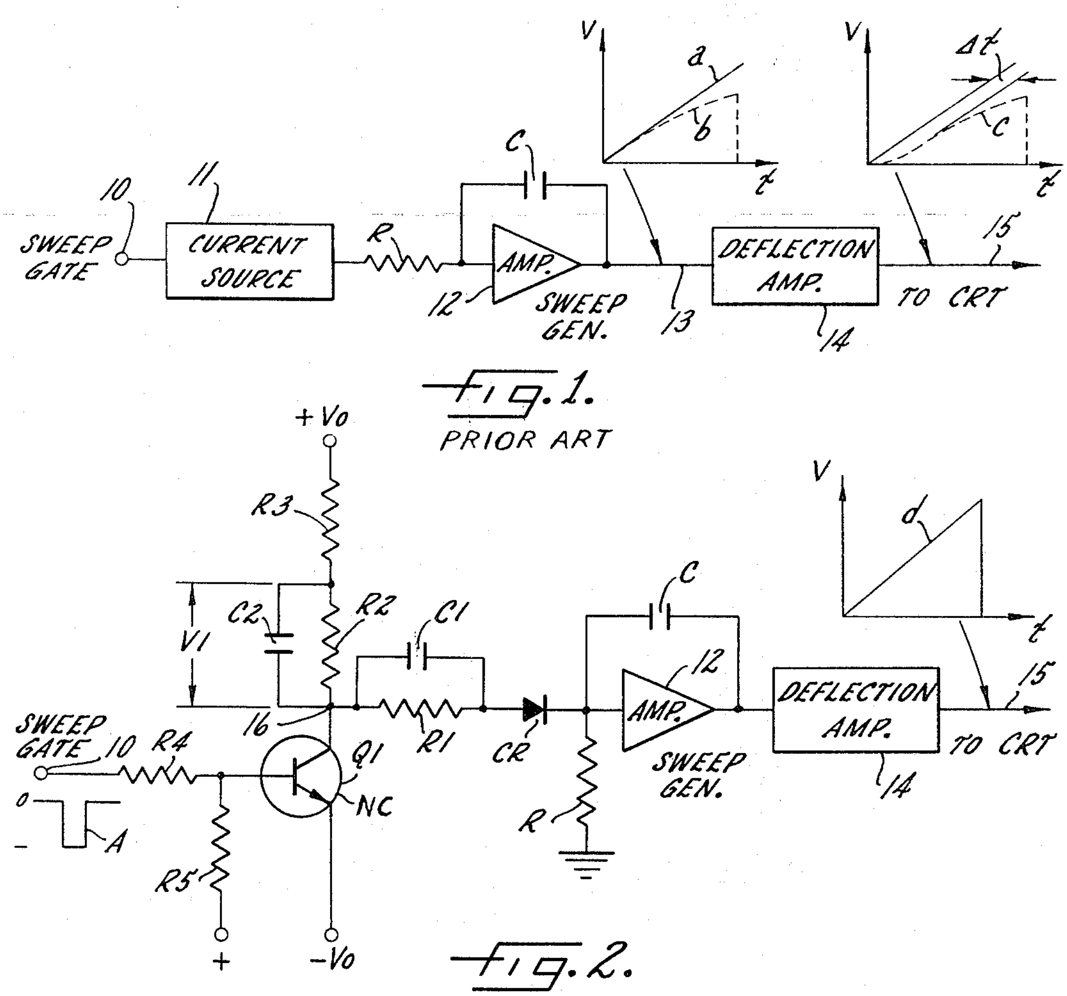
FIG. 1. PRIOR ART FIG. 2.
FIGURE 1 is a partially block and partially circuit schematic of a generally known sweep generator circuit for the deflection circuits of a cathode ray tube.
FIGURE 2 illustrates partly in block and partly in circuit schematic the ramp voltage generator of FIGURE 1 with the bandwidth compensating circuit in combination therewith.

Referring more particularly to FIGURE 1, a gating pulse source is adapted to be applied to terminal 10 to which is applied a current source 11 through a resistor R to the sweep voltage generator amplifier 12. The amplifier 12 has a feedback through a capacitor C to the input of the amplifier which capacitor C, together with resistor R, provides the effective integrating circuit for the sweep voltage generator amplifier 12. The sweep voltage generator produces a sweep voltage on the output 13 as shown by the graph above this conductor on a voltage-time basis to produce the sweep voltage *b*. The nonlinearity appears with respect to the line *a* the output 13 of the sweep generator is coupled to a deflection amplifier 14, output 15 of which is to the cathode ray tube deflection circuits, as is well understood by those skilled in the art. On the output 15 will appear a sweep voltage *c* which originates from the initial point of the voltage-time graph and deviates from the true linear voltage by time delay $\Delta t$. This time lag therefore will be operative to delay the sweep voltages to the cathode ray tube causing initial distortion in the sweep circuits of the cathode ray tube which is very undesirable for high speed operating cathode ray tubes for accurate radar target designation.

Referring more particularly to FIGURE 2, the sweep generator, consisting of the integrating circuit RC and the amplifier 12, and the deflection amplifier 14 are coupled in the same manner as shown for FIGURE 1 and, accordingly, retain like reference characters. In the input to the RC integrator and amplifier 12 is a crystal rectifier CR cathode coupled to the RC integrator and amplifier 12. The anode of the crystal rectifier CR is coupled through a parallel resistance R1 and capacitor C1 network to a terminal point 16. Terminal 16 is coupled through a parallel resistance R2 and capacitance C2 network which parallel network is coupled through a resistor R3 to a positive voltage source V*o*. Terminal point 16 is likewise coupled to the collector of a transistor Q1, the emitter of which is directly coupled to the negative terminal of V*o*. The base of transistor Q1 is coupled to the sweep gate input terminal 10 through a resistor R4 and also through a base biasing resistor R5 to a positive voltage source. The resistor R5 biases the transistor Q1 such that it is conducting at saturation in the absence of a negative sweep gating pulse, such as that shown by the pulse A.

OPERATION

In the operation of the device let it be assumed that no sweep gate pulse appears at terminal 10 in which this terminal is standing at zero potential and that the bias on the base by way of resistor R5 holds transistor Q1 in saturation to hold the collector and consequently, the junction terminal 16 at slightly negative potential. This slightly negative potential at the terminal 16 back-biases the crystal rectifier CR so that no current is flowing to the sweep generator and integrator circuits. The collector current flowing in this state is determined by the resistors R2 and R3 causing a direct current (D.C.) voltage drop across the capacitor C2. Capacitor C1 has no charge because no current is flowing in this leg by virtue of the crystal rectifier CR being back-biased.

If a negative sweep gate pulse A is applied to terminal 10, transistor Q1 will be immediately cut off and current will start to flow to the sweep generator. The initial current $i1$ will be given by the following:

$$i1=\frac{Vo-V1}{R3+Rd}$$

where V1 is the voltage drop across capacitor C2 and where R$d$ represents the crystal rectifier CR forward resistance. The initial current will drop off rapidly to a steady state condition which is given by the following equation:

$$i2=\frac{Vo}{R1+R2+R3+Rd}$$

Figure 3:
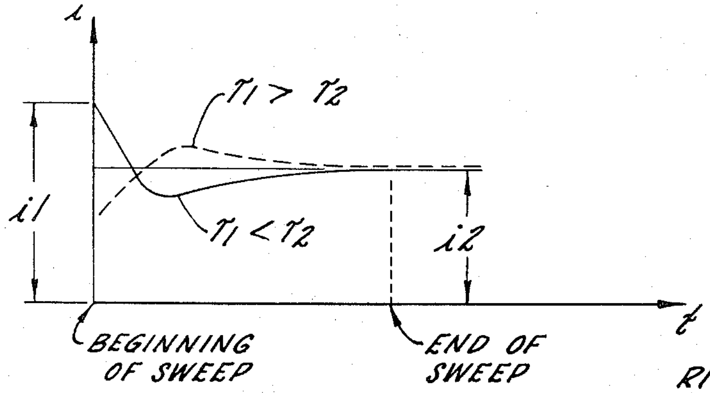
FIGURE 3 illustrates a graph of the current time relation of the bandwidth compensating circuit of FIGURE 2.

The current-time relationship for the network in FIGURE 2 is illustrated in the graph of FIGURE 3. This current-time relationship is a function of the two time constants established by C1R1 and C2R2. If T1 represents the time constant of C1R1 and T2 represents the time constant of C2R2, the current-time relationship will be a function of the two time constants T1 and T2 and the ratio of R1R2 to R3. If the time constant T1 is smaller than the time constant of T2, the current will start with a large initial peak as shown by the solid line in FIGURE 3, will decay fast, and will rise slowly towards the final value $i2$. If the time constant of T1 is larger than the time constant of T2, the current flow will start at a low value, will rise rapidly, and will fall slowly to the final or steady state current $i2$. For the purpose of this invention in bandwidth compensation in order for the sweep generator to minimize the nonlinearities of the sweep generator and the delay produced through the deflection amplifier 14, it is desirable to have the time constant T1 smaller than the time constant T2 to produce a high initial current which rapidly comes to a steady state current $i2$, as shown in FIGURE 3 by the solid graph line.

In FIGURE 2, when the sweep gating pulse A cuts off transistor Q1, a high current is conducted through C1 and CR as a result of the stored voltage V1 applied from across capacitor C2 to produce the high current $i1$ shown in FIGURE 3. Discharge of C2 is rapidly accomplished and current from the voltage source V$o$ through resistors R3, R2, and R1 and through the crystal rectifier CR to the sweep generator produces, together with the high peak current from C2, an over-compensated sweep voltage from the sweep generator which is applied to the deflection amplifier 14. This over-compensated sweep voltage from the sweep generator compensates for the lag $\Delta t$ produced by the deflection amplifier to produce on the deflection amplifier output a substantially linear sweep voltage $d$, as shown above the output conductor 15 to the cathode ray tube. This output starts sweep currents flowing in the cathode ray tube deflection circuits substantially at the beginning of time when the sweep gating pulse is applied to the circuit. It may be pointed out that the integrator waveform deficiency can be completely compensated, whereas a 100% correction of the deflection amplifier delay is not feasible. The exponential integrator output will be compensated by the slowly rising integrator input, resulting in a very nearly linear output, as shown by $d$ over the conductor 15. In this manner the sweep generator amplifier and integrator deficiencies can be reduced to a large degree, thus permitting better accuracy with fast sweeps and existing amplifiers. The corrective portion of the network is of passive nature. The compensating accuracy is dependent only on constant amplifier characteristics. It is usable at highest sweep speeds and the switching transistor does not affect the compensating performance.

While many modifications and changes may be made in the constructional details and features of this invention without departing from the spirit and scope thereof, it is to be understood that we desire to be limited in our invention only by the scope of the appended claims.

We claim:

1. Bandwidth compensation for high speed ramp voltage generation comprising:

a sweep voltage generator having an input and an output;

a unidirectional means in said input oriented with the low impedance direction toward said sweep voltage generator;

a direct current voltage source;

a first resistor-capacitor parallel network and an electron emission device with conduction electrodes coupled in series with said network across said voltage source, said electron emission device having a control electrode;

a second resistor-capacitor parallel network coupling the juncture of said first resistor-capacitor network and said electron emission device with said unidirectional means; and a gating signal input coupled to said control electrode whereby sweep voltages generated by said sweep voltage generator and current delays are compensated by compensating the gating signals in said networks and electron emission means to minimize the nonlinearity of said generated sweep voltages and current delays on the output of said sweep voltage generator.

2. Bandwidth compensation for high speed ramp voltage generation as set forth in claim 1 wherein said unidirectional means is a diode, and wherein said electron emission device is a transistor, the two conduction electrodes thereof being the emitter and collector and said control electrode being the base.

3. Bandwidth compensation for high speed ramp voltage as set forth in claim 2 wherein said sweep voltage generator includes a coupled integrator and amplifier to provide an integrated time constant of said compensating gating signals amplified to produce said sweep voltage.

4. A bandwidth compensating circuit for high speed ramp voltage generators comprising:

a ramp voltage generator having an input and an output and consisting of an amplifier having an integrating feedback circuit from the output to said input;

a diode having its cathode coupled to said generator input;

a direct current voltage source;

a first resistor and capacitor parallel network and a second resistor and capacitor parallel network coupled in series from the positive terminal of said voltage source to the anode of said diode; and a transistor having a collector coupled to the terminal junction of said first and second networks, an emitter coupled to the negative terminal of said direct current voltage source, and a base coupled to receive sweep gate pulses, said base being biased to maintain said transistor in saturation whereby each negative sweep gate signal will cut off conduction of said transistor to develop an over compensated voltage signal on the input of said sweep voltage generator to generate an over compensated linear sweep voltage on the sweep voltage generator output to compensate for delays in sweep voltage in subsequent amplifier circuitry.

5. A bandwidth compensating circuit as set forth in claim 4 wherein said transistor is of the NPN type, and wherein said first resistor and capacitor parallel network is constructed of elements to produce a time constant smaller than the time constant of said second resistor and capacitor parallel network whereby the current at the junction of the first and second networks start at an initial peak and decays rapidly to compensate for the delay and distortion in the ramp voltage generated and connected circuitry.

(Other references on following page)

References Cited by the Examiner

UNITED STATES PATENTS

| | | | |
|---|---|---|---|
| 2,449,969 | 9/1948 | Wright | 328—184 X |
| 2,681,411 | 6/1954 | Washburn | 328—184 |
| 2,923,850 | 2/1960 | Raffensperger | 328—184 X |
| 3,098,171 | 7/1963 | Ashley | 328—184 X |
| 3,221,259 | 11/1965 | Bates | 328—184 |

ARTHUR GAUSS, *Primary Examiner.*

J. S. HEYMAN, *Assistant Examiner.*